Figure 1:
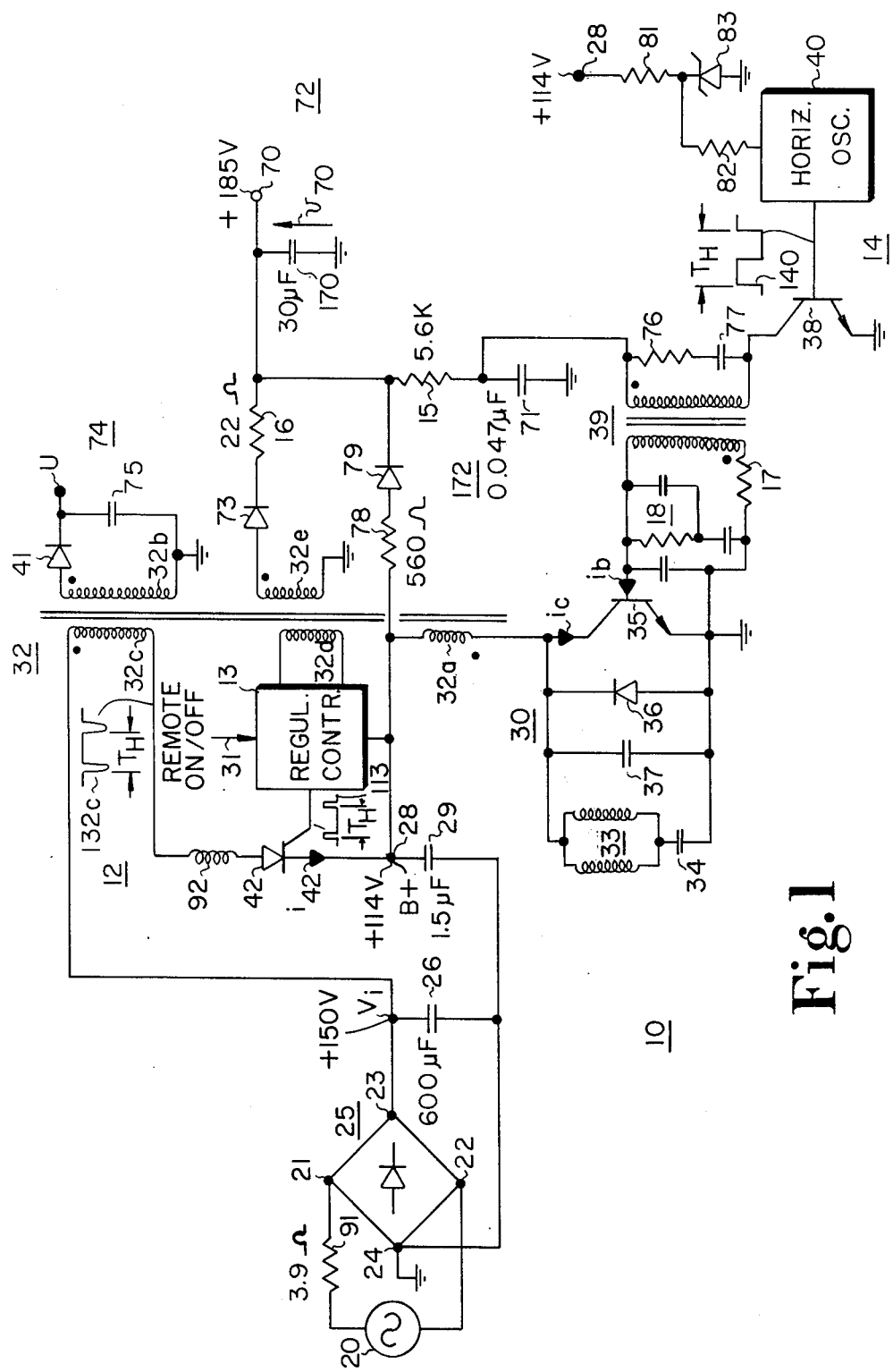

United States Patent [19]

Luz et al.

[11] 4,282,460

[45] Aug. 4, 1981

[54] DEFLECTION AND POWER SUPPLY CIRCUIT WITH REDUCED START-UP DRIVE

[75] Inventors: David W. Luz; Donald H. Willis, both of Indianapolis, Ind.

[73] Assignee: RCA Corporation, New York, N.Y.

[21] Appl. No.: 92,227

[22] Filed: Nov. 19, 1979

[51] Int. Cl.³ .................. H01J 29/70; H01J 29/76
[52] U.S. Cl. .................................... 315/411; 315/408
[58] Field of Search ...................... 315/411, 408, 399

[56] References Cited

U.S. PATENT DOCUMENTS

| | | | |
|---|---|---|---|
| 3,949,403 | 4/1976 | Yoshida et al. | 343/225 |
| 4,024,577 | 5/1977 | Diethelm | 358/190 |
| 4,112,465 | 9/1978 | Willis | 315/411 |

*Primary Examiner*—Theodore M. Blum
*Attorney, Agent, or Firm*—P. J. Rasmussen; W. H. Meagher; J. J. Laks

[57] ABSTRACT

In a remote controlled television receiver, the regulator circuit of the main television receiver power supply is made responsive to a remote on/off command signal in order to turn the receiver on and off. A deflection flyback transformer provides operating voltages to the ultor supply and other auxiliary supplies which power such load circuits as audio and vertical deflection. A horizontal output transistor is coupled to a B+ operating voltage terminal of the main power supply through a flyback transformer primary winding. After initiation of the on-state of the command signal, the regulator ciruit rapidly develops a B+ operating voltage. The initially uncharged filter capacitors of the auxiliary supplies act as a low impedance shunt across the flyback transformer primary winding during the start-up interval. To limit the horizontal output transistor collector current and power dissipated during start-up, the horizontal driver stage holds the forward base current supplied to the horizontal output transistor each deflection cycle during start-up below the steady-state value.

9 Claims, 2 Drawing Figures

DEFLECTION AND POWER SUPPLY CIRCUIT WITH REDUCED START-UP DRIVE

This invention relates to a deflection and power supply circuit with reduced start-up drive.

A color television receiver typically requires several supply voltages for operation. A B+ operating voltage is required in order to generate horizontal scanning current. A high voltage is required for accelerating electron beams within the television receiver picture tube. Low operating voltages are required for energizing various other television receiver circuits such as the deflection generator, video and audio circuits. All these supply voltages are ultimately derived from a main B+ power supply. The main B+ power supply typically includes a regulator circuit such as a switching regulator for maintaining a constant operating voltage as the AC power line voltage varies and as beam current loading of the ultor terminal varies.

In many conventional remote controlled television receivers, the receiver is turned on by actuation of an electromechanical relay in series with the AC power line. It is possible to eliminate the electromechanical relay by providing a regulator circuit which is responsive to remote on/off command signals. When using a remote responsive switching regulator with a series pass semiconductor switch, such as described in copending U.S. patent application Ser. No. 080,839, filed Oct. 1, 1979, by D. H. Willis, entitled "HIGH VOLTAGE DISABLING CIRCUIT FOR A TELEVISION RECEIVER", the remote on/off command circuitry will enable the semiconductor switch to begin switching action and develop a B+ operating voltage, thereby energizing the remaining television receiver circuits. Similarly, the remote on/off command circuitry, when in the off-state, will cause the semiconductor switch to cease its switching action, thereby removing the B+ operating voltage and turning off the television receiver.

When using a remote responsive power supply to turn the television receiver on and off, the B+ operating voltage may be developed at the power supply output terminal relatively rapidly. During the start-up interval, after energization of the television receiver, relatively large currents will be drawn by the auxiliary power supplies to charge the initially uncharged filter capacitances. With the B+ operating voltage being rapidly developed at the outset of the start-up interval, relatively large reflected load currents can flow in the collector circuit of the horizontal output transistor.

A feature of the invention is to reduce undesirable dissipation within the output transistor and decrease the component stress during the heavy load conditions encountered at start-up. In an inventive arrangement, the driver stage to the horizontal output transistor holds the forward base current in the output stage during start-up to a level below that attained during steady-state operation. The output transistor collector current is thereby limited and output dissipation is reduced. In a specific embodiment of the invention, a voltage integrating circuit is coupled between the B+ operating terminal and the driver stage collector circuit, thereby slowly increasing the driver stage collector supply voltage after initiation of the television receiver on-state.

Figure 2:
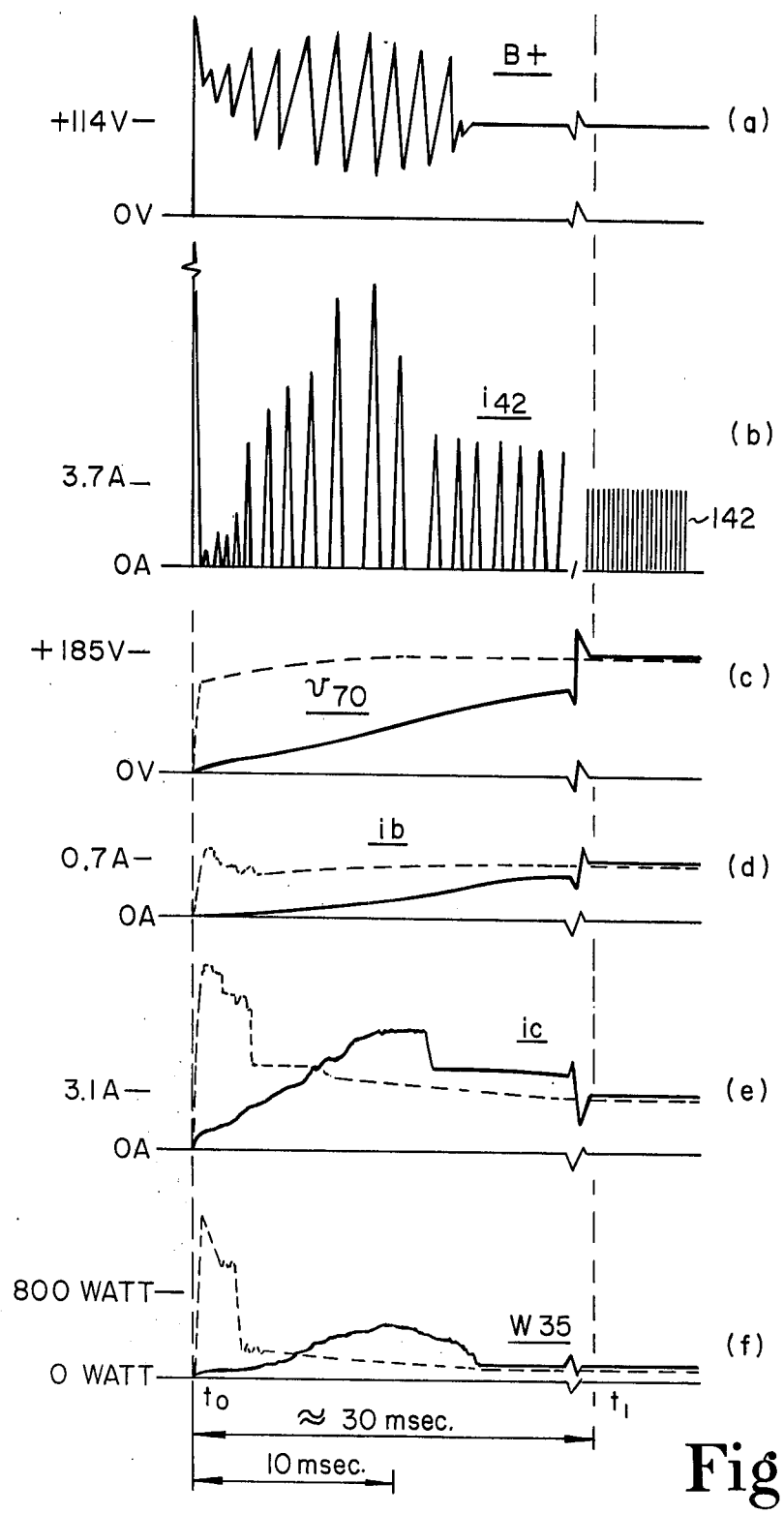

FIG. 1 illustrates a deflection and power supply circuit embodying the invention; and FIG. 2 illustrates waveforms associated with the circuit of FIG. 1.

In the deflection and power supply circuit 10, illustrated in FIG. 1, a source 20 of alternating current voltage, such as the AC power line or mains supply voltage, is coupled to input terminals 21 and 22 of a full-wave bridge rectifier 25. A resistor 91 provides surge current limiting. A filter capacitor 26 is coupled across the output terminals 23 and 24 of rectifier 25 with terminal 24 functioning as a ground or common current return terminal. A filtered but unregulated DC input voltage $V_i$ is developed across filter capacitor 26.

The input voltage $V_i$ is applied to a winding 32c of a horizontal output or flyback transformer 32. Flyback transformer winding 32c is part of a switching regulator and main power supply 12 which includes an inductor 92 and a series pass semiconductor switch, SCR 42. SCR 42 is gated into conduction each horizontal trace interval by gating pulses 113 developed within a regulator control circuit 13. When SCR 42 is gated into conduction, current flows from terminal 23 through SCR 42 to an input terminal 28, at which terminal a regulated B+ operating voltage is developed. A horizontal rate ripple filter capacitor 29 is coupled between input terminal 28 and ground terminal 24. SCR 42 is commutated off during the horizontal retrace interval by a negative horizontal retrace pulse 132c developed by flyback transformer winding 32c. Synchronization with horizontal deflection is attained by coupling a flyback transformer secondary winding 32d to regulator control circuit 13. To achieve regulation, the turn-on instant of SCR 42 is varied within the horizontal trace interval in response to a feedback of the B+ voltage to the regulator control circuit 13.

The B+ voltage developed at input terminal 28 is applied to a first terminal of the primary winding 32a of flyback transformer 32. The series arrangement of a horizontal deflection winding 33 and a trace capacitor 34 is coupled between the other terminal of primary winding 32a and ground. A horizontal deflection generator 30 including a horizontal output transistor 35, a damper diode 36 and a retrace capacitor 37, is coupled to horizontal deflection winding 33 in order to generate scanning current in the deflection winding.

Horizontal output transistor 35 is switched into and out of conduction each horizontal deflection cycle by a horizontal oscillator and driver circuit 14. A horizontal oscillator 40 applies a horizontal rate, $1/T_H$, square-wave voltage 140 to the base of a horizontal driver transistor 38. Supply voltage for horizontal oscillator 40 is provided from the B+ operating voltage terminal 28 through resistors 81 and 82, with the junction of the resistors coupled to a zener diode 83.

The collector of horizontal driver transistor 38 is coupled to one terminal of a primary winding of a driver transformer 39. The other terminal of the primary winding is coupled to a supply voltage terminal 70 through a resistor 15. A supply voltage $v_{70}$, illustratively of +185 volts DC, is developed at terminal 70 and provides collector voltage for driver transistor 38.

One terminal of a secondary winding of driver transformer 39 is coupled to the base of horizontal output transistor 35 and the other terminal of the secondary winding is coupled to the emitter of transistor 35 through a resistor 17. The square-wave voltage 140 is amplified by driver transistor 38 and applied by means of transformer 39 across the base and emitter electrodes of horizontal output transistor 35 to provide a base current $i_b$ which turns on transistor 35 before the center of horizontal trace. Square-wave voltage 140 also causes transistor 35 to turn off to initiate horizontal retrace. Resistor 17 and an RC network 18 coupled across the base and emitter electrodes of transistor 35 provide waveshaping of the base current $i_b$ and transient filtering. Additionally, transient damping is provided by a resistor 76 and a capacitor 77 coupled across the primary winding of driver transformer 39. A capacitor 71 is coupled to the junction of resistors 15 and 76.

The +185 volts developed at terminal 70 serves as an auxiliary supply voltage for other television receiver circuits such as the picture tube driver stages. The +185 volts is developed by an auxiliary power supply 72 comprising a flyback transformer secondary winding 32e, a rectifier 73, a surge limiting resistor 16 and a filter capacitor 170. Another auxiliary power supply 74 provides an ultor accelerating potential or high voltage at a terminal U. The high voltage is generated by rectifying, through a diode 41, the voltage developed across a high voltage winding 32b of flyback transformer 32 and filtering the rectified voltage by an ultor capacitor 75. Other flyback transformer secondary windings, not illustrated, may provide additional auxiliary power supply voltages for such circuits as the vertical deflection circuit and the audio circuit.

When the load circuits coupled to auxiliary power supplies 72 and 74 draw load current, a reflected load current component flows in flyback transformer primary winding 32a to become a component of the collector current $i_c$ of horizontal output transistor 35. With auxiliary supplies 72 and 74 deriving their supply voltages by rectifying the voltages developed across flyback transformer secondary windings 32e and 32b, operative power for many of the television receiver circuits is therefore ultimately derived from power supply switching regulator 12 which generates the B+ voltage at terminal 28. Without the B+ voltage being developed, deflection generator 30 cannot be energized and pulse voltages cannot be developed across the flyback transformer windings for use by the auxiliary power supplies.

Turn-on and turn-off of the television receiver may be controlled by applying an on/off command signal to regulator control circuit 13 along a conductor line 31. Such an on/off command signal may be generated by conventional remote control television receiver circuitry, not illustrated. Regulator control circuit 13 may be similar to the circuit disclosed in the aforementioned U.S. patent application of D. H. Willis, and hereby incorporated by reference.

With the television receiver being turned on and off by the command signals applied to regulator control circuit 13, an electromechanical relay in series with the AC power line source 20 is not required. Bridge rectifier 25 thus applies the DC or rectified alternating power line voltage to terminal 23 even in the off-state of the television receiver. No voltage, however, is developed at input terminal 28 when the television receiver is in the off-state because SCR 42 is not being gated into conduction. Without a B+ operating voltage at terminal 28, deflection generator 30 is deenergized, and no auxiliary supply voltages are available to power the television receiver circuits, including horizontal driver transistor 38.

Upon application of a turn-on command signal along conductor line 31, gating pulses to turn on SCR 42 are developed by regulator control circuit 13. Because capacitor 29 is of relatively small value, needed only to filter horizontal rate ripple components, B+ voltage is quickly developed at terminal 28 after initiation of the on-state. Horizontal oscillator 40 begins to generate square-wave voltage 140 almost simultaneously with the development of voltage at input terminal 28.

During this initial or start-up interval, collector voltage for horizontal driver transistor 38 must be provided in order to begin the switching of horizontal output transistor 35. The +185 volts which is present at terminal 70 during the steady-state interval is not available during the start-up interval. A start-up supply 172 provides the driver transistor collector voltage during the start-up interval. Start-up supply 172 comprises a resistor 78 and a diode 79 as well as filter capacitor 170.

With resistor 78 coupled to input terminal 28, filter capacitor 170 charges from the B+ operating voltage and provides the required start-up interval collector voltage for driver transistor 38. When steady-state conditions are obtained, the steady-state voltage of +185 volts developed at terminal 70 is derived from the retrace pulse developed across flyback transformer secondary winding 32e. Diode 79 then becomes reverse biased and disconnects input terminal 28 from supply terminal 70 and the collector circuit of driver 38.

At the outset of the start-up interval, the filter capacitors of the auxiliary power supplies, such as filter capacitors 170 and 75, are uncharged. As soon as sufficient positive or forward base current is supplied to horizontal output transistor 35 to initiate conduction of transistor 35, current begins to flow in primary winding 32a. Retrace pulses begin to be developed across the flyback transformer secondary windings and relatively large transient or charging currents can flow to charge the auxiliary power supply filter capacitors.

At the outset of the start-up interval, after initiation of the on-state of the television receiver at time $t_0$ of the solid-line waveforms of FIGS. 2a–2f, the input voltage $V_i$ has been charged to nearly the peak of the AC power line voltage developed by source 20. At time $t_0$, a gating pulse 113 turns on SCR 42. A relatively large spike of current charges capacitor 29 to a value which can even exceed the input voltage $V_i$, as illustrated in FIG. 2b by the current $i_{42}$ flowing through SCR 42 and as illustrated in FIG. 2a by the B+ voltage at terminal 28. During the startup interval, which extends from time $t_0$-$t_1$ of FIGS. 2a–2f, the B+ voltage undergoes a relatively slow oscillation and relatively large spikes in the current $i_{42}$ occur due to the current flowing in SCR 42 being initially too large to permit the negative retrace pulses 132c to commutate the SCR off each deflection cycle. During steady-state operation, however, after time $t_1$, SCR current $i_{42}$ comprises horizontal rate triangular pulses, illustrated schematically in FIG. 2b as vertical lines 142.

During the start-up interval, the initially uncharged filter capacitors of the auxiliary power supplies, such as ultor filter capacitor 75, begin to draw reflected load current in primary winding 32a. This reflected load current flows as a component of the collector current $i_c$ of horizontal output transistor 35. A feature of the invention is to prevent undue stress on horizontal output transistor 35 and reduce the peak power dissipation within the device while the auxiliary power supply filter capacitors attempt to draw relatively large magnitude charging currents.

Resistor 78 and capacitor 170 of start-up supply 172 form a voltage integrating circuit. Upon initial energization of the television receiver, at time $t_0$, the B+ operating voltage, illustrated in FIG. 2a, is integrated by the action of resistor 78 and capacitor 170 to develop a slowly increasing voltage $v_{70}$ at terminal 70, as illustrated in FIG. 2c. Because the voltage $v_{70}$ serves as the collector supply voltage for driver transistor 38, the slowly increasing voltage $v_{70}$ enables a slowly increasing base current $i_b$ to be developed in horizontal output transistor 35, as illustrated in FIG. 2d by the envelope waveform of the base current $i_b$. Only the envelope of the positive or forward base current is illustrated in FIG. 2d, with the negative portion or reverse base current being omitted from illustration.

With integrating resistor 78 and capacitor 170 functioning to reduce the base current drive to horizontal output transistor 35 during the start-up interval, horizontal output transistor 35 is operated during this interval out of saturation, with its collector current $i_c$ slowly increasing, as illustrated in FIG. 2e by the envelope waveform of the collector current $i_c$. Thus, although the initially uncharged capacitors of the auxiliary power supplies act as a relatively low impedance shunt across flyback transformer winding 32a, the collector current $i_c$ is limited by the slowly increasing base drive $i_b$. A relatively small collector current flows at the outset of the start-up interval and continues to gradually increase, tracking the increase in supply voltage $v_{70}$ and base current $i_b$. The peak power dissipation $W_{35}$ within horizontal output transistor 35 is relatively small, especially at the outset of the start-up interval, near time $t_0$, as illustrated by the waveform envelope of FIG. 2f.

The problem of undue peak power collector current dissipation within horizontal output transistor 35 during start-up may be especially severe in a deflection and power supply circuit such as circuit 10 of FIG. 1. Because circuit 10 does not use an electromechanical relay as part of the remote control energizing circuitry, the input voltage $V_i$ is present at terminal 23 in both the on and off states of the television receiver. Energization of deflection generator 30 and, thus, ultimately of many other television receiver circuits, is accomplished by the remote control turn-on of SCR 42, which functions as a series-pass semiconductor switching element. SCR 42 is nonconductive during a significant portion of the start-up interval, as illustrated by the SCR current $i_{42}$ of FIG. 2b. If the collector supply voltage for horizontal output transistor 35 were not limited, the peak collector current $i_c$ could undesirably become quite large while still providing a predetermined average load current during start-up.

Furthermore, by using a controlled rectifier as a switching element, retrace pulses are required for commutation of the rectifier. Oscillations of the B+ voltage may develop during the start-up interval, as illustrated in FIG. 2a, since the retrace pulse magnitude is insufficient to commutate off the SCR for the relatively heavy initial loading conditions encountered. The B+ voltage may exceed its steady-state value, tending to produce a larger collector current $i_c$. Both of the above factors tend to contribute to a relatively large start-up collector current flowing in horizontal output transistor 35.

The dashed waveforms of FIGS. 2c-2f illustrate an undesirable quick-start situation wherein the voltage integration performed within start-up supply 172 is essentially eliminated. For example, if resistor 78 is replaced by a short-circuit, the driver stage collector supply voltage $v_{70}$ increases very rapidly to near steady-state levels, as illustrated by the dashed waveform in FIG. 2c. The forward base current $i_b$ is no longer held below its steady-state level but reaches values during start-up, after time $t_0$ but before time $t_1$, that are greater than the steady-state level, as illustrated by the dashed waveform, FIG. 2d. As illustrated in the dashed waveforms of FIGS. 2e and 2f, the peak output transistor collector current and peak power dissipated is substantially greater during start-up than during steady-state.

By providing a voltage integrating circuit within the start-up supply 172, the B+ voltage at terminal 28 is integrated to provide a slowly increasing collector voltage at terminal 70 for use by driver transistor 38 during the start-up interval. The time constant of the voltage integrating circuit is selected to hold the peak output transistor collector current during start-up below that developed during the steady-state interval. A time constant of the order of ten milliseconds may typically be selected, with that of FIG. 1 being about 17 milliseconds. Base current for horizontal output transistor 35 is reduced below steady-state values during the start-up interval and undue peak power dissipation within the transistor is thereby avoided.

We claim:
1. A deflection and power supply circuit, comprising:
a deflection winding;
a deflection generator including transistor switching means coupled to said deflection winding for generating scanning current in said deflection winding;
a source of DC supply voltage;
power supply means coupled to said deflection generator and responsive to the state of an on/off command signal for energizing said deflection generator;
means for applying said DC supply voltage to an input terminal of said power supply means during both states of said on/off command signal, said power supply means developing an operating voltage at an output terminal only during the on-state of said command signal;
a transformer including first and second windings, said first winding coupled to said power supply means and to said transistor switching means;
a load circuit;
a first auxiliary power supply coupled to said second winding and to said load circuit for providing power to said load circuit, with current drawn by said auxiliary power supply developing collector current in said transistor switching means, said auxiliary power supply drawing a transient load current during a start-up interval after initiation of said on-state that is greater than the steady-state load current;
a driver stage coupled to said transistor switching means and responsive to a deflection rate signal for periodically providing forward base current to turn on said transistor switching means each deflection cycle; and
means coupled to said driver stage for holding the peak magnitude of said forward base current each deflection cycle during said start-up interval to a magnitude less than that reached during said steady-state interval in order to limit said transistor switching means collector current when said auxiliary power supply draws said transient load current.

2. A circuit according to claim 1 wherein said holding means comprises a voltage integrating circuit coupled to said output terminal and a main current conducting path of said driver stage for providing a driver supply voltage for said main current conducting path derived from said operating voltage.

3. A circuit according to claim 2 wherein the time constant associated with said voltage integrating circuit is of the order of ten milliseconds.

4. A circuit according to claim 2 including a second auxiliary power supply coupled to a winding of said transformer for providing said driver supply voltage during said steady-state interval, said voltage integrating circuit including start-up disconnect means for disconnecting said output terminal from said driver stage main current conducting path after the lapse of said start-up interval.

5. A circuit according to claim 4 wherein said operating voltage is applied to said first winding of said transformer.

6. A circuit according to claims 1, 2, 4, or 5 wherein said power supply means comprises controllable switching means and a control circuit coupled to said switching means for periodically turning on said switching means, said control means responsive to said on/off command signal for maintaining said switching means nonconductive during the off-state of said command signal.

7. A circuit according to claim 6 wherein said controllable switching means comprises a controlled rectifier, said rectifier being periodically commutated off, and wherein said operating voltage during at least a portion of said start-up interval exceeds the steady-state operating voltage.

8. A circuit according to claim 7 wherein said transformer comprises a flyback transformer and said first auxiliary power supply comprises a high voltage circuit for providing power to an ultor load circuit.

9. A deflection and power supply circuit, comprising:
a deflection winding;
a deflection generator including transistor switching means coupled to said deflection winding for generating scanning current in said deflection winding;
a source of input voltage;
power supply means coupled to said source and to said deflection generator and responsive to an energizing command signal for energizing said deflection generator and for developing an operating voltage at a supply terminal;
a flyback transformer including first and second windings, said first winding coupled to said transistor switching means and to said power supply means;
an auxiliary power supply coupled to said second winding and including a filter capacitance for providing power to a load circuit, said filter capacitance initially uncharged at the outset of a start-up interval, the loading of said second winding by said auxiliary power supply affecting the current in the first flyback transformer and in a collector path of said switching means, the loading of said second winding by said auxiliary power supply being greater during said start-up interval than during the steady-state interval;
a transistor driver stage coupled to said transistor switching means and responsive to a deflection rate input signal for periodically providing base current to turn on said transistor switching means each deflection cycle;
a driver stage power supply coupled to the collector circuit of said transistor driver stage for providing a collector supply voltage during said steady-state interval; and
a driver stage start-up supply for providing said collector supply voltage during said start-up interval, including voltage integrating means having an input terminal receiving said operating voltage and an output terminal coupled to said collector circuit of said transistor driver stage and means for disconnecting said supply terminal from said collector circuit of said transistor driver stage after the lapse of said start-up interval, the time constant of said voltage integrating means selected to hold the peak base current of said transistor switching means during the start-up interval below that developed during the steady-state interval.

* * * * *